United States Patent
Liu

(10) Patent No.: US 8,252,679 B2
(45) Date of Patent: Aug. 28, 2012

(54) SEMICONDUCTOR PROCESS

(75) Inventor: An-Chi Liu, Tainan (TW)

(73) Assignee: United Microelectronics Corp., Hsinchu (TW)

( * ) Notice: Subject to any disclaimer, the term of this patent is extended or adjusted under 35 U.S.C. 154(b) by 253 days.

(21) Appl. No.: 12/703,518

(22) Filed: Feb. 10, 2010

(65) Prior Publication Data

US 2011/0195571 A1 Aug. 11, 2011

(51) Int. Cl.
*H01L 21/28* (2006.01)
(52) U.S. Cl. ........ 438/637; 438/653; 438/687; 257/751; 257/762; 257/E21.577; 257/E21.584; 257/E21.585
(58) Field of Classification Search .................. 438/639, 438/653, 677, 687, 702, 703, 637, 906; 257/E21.577, E21.584, E21.585, 751, 762
See application file for complete search history.

(56) References Cited

U.S. PATENT DOCUMENTS

| | | | | |
|---|---|---|---|---|
| 5,627,102 A * | 5/1997 | Shinriki et al. | ............... | 438/648 |
| 5,677,237 A * | 10/1997 | Tsai et al. | ...................... | 438/627 |
| 5,763,948 A * | 6/1998 | Sumi | .............. | 257/763 |
| 5,956,608 A * | 9/1999 | Khurana et al. | ............. | 438/627 |
| 5,960,320 A * | 9/1999 | Park | .............. | 438/688 |
| 5,963,833 A * | 10/1999 | Thakur | ....................... | 438/677 |
| 6,090,702 A * | 7/2000 | Okamoto | ....................... | 438/637 |
| 6,177,343 B1 * | 1/2001 | Watanabe et al. | ............. | 438/639 |
| 6,313,042 B1 | 11/2001 | Cohen et al. | | |
| 6,395,642 B1 * | 5/2002 | Liu et al. | ....................... | 438/720 |
| 6,432,815 B2 * | 8/2002 | Yokoi | ............................ | 438/627 |
| 6,840,249 B2 * | 1/2005 | Seo | ................................. | 134/1.2 |
| 6,906,420 B2 * | 6/2005 | Harada | ........................ | 257/754 |
| 7,087,534 B2 * | 8/2006 | Chen | ............................. | 438/751 |
| 7,111,629 B2 * | 9/2006 | Kim et al. | ..................... | 134/1.2 |
| 7,135,404 B2 * | 11/2006 | Baskaran et al. | ............. | 438/652 |
| 7,341,946 B2 * | 3/2008 | Kailasam et al. | ............. | 438/687 |
| 7,405,157 B1 * | 7/2008 | Reid et al. | ....................... | 438/677 |
| 7,476,604 B1 * | 1/2009 | Cheng et al. | .................. | 438/597 |
| 7,628,866 B2 * | 12/2009 | Lin et al. | ........................... | 134/2 |
| 7,645,695 B2 * | 1/2010 | Oh et al. | ....................... | 438/622 |
| 7,700,497 B2 * | 4/2010 | Li | ............................... | 438/750 |
| 7,737,005 B2 * | 6/2010 | Tada et al. | ..................... | 438/477 |
| 7,767,585 B2 * | 8/2010 | Saga et al. | .................... | 438/720 |
| 7,846,834 B2 * | 12/2010 | Yang et al. | .................... | 438/637 |
| 8,039,391 B1 * | 10/2011 | Yin et al. | ....................... | 438/656 |
| 2003/0068887 A1 * | 4/2003 | Shingubara et al. | ......... | 438/687 |
| 2003/0076929 A1 * | 4/2003 | Hoheisel et al. | ............. | 378/98.8 |
| 2003/0121527 A1 * | 7/2003 | Seo | ................................. | 134/1.2 |
| 2004/0058525 A1 * | 3/2004 | Abe | .............................. | 438/629 |
| 2004/0163681 A1 * | 8/2004 | Verhaverbeke | ................. | 134/28 |
| 2007/0224811 A1 * | 9/2007 | Wang et al. | ................... | 438/678 |
| 2010/0099258 A1 * | 4/2010 | Hoh | .............................. | 438/689 |
| 2011/0195571 A1 * | 8/2011 | Liu | ............................... | 438/653 |

* cited by examiner

*Primary Examiner* — Mary Wilczewski
(74) *Attorney, Agent, or Firm* — WPAT., P.C.; Justin King

(57) ABSTRACT

A semiconductor process is described. A substrate with at least one conductive region is provided, on which a dielectric layer is formed. An opening is formed in the dielectric layer, such that the conductive region is exposed. A first conductive layer is conformally formed on the surface of the opening. A first cleaning step is conducted using a first cleaning solution. A baking step is conducted after the first cleaning step. Afterwards, the opening is filled with a second conductive layer.

16 Claims, 5 Drawing Sheets

SEMICONDUCTOR PROCESS

BACKGROUND OF THE INVENTION

1. Field of the Invention

The present invention relates to a semiconductor process, and more particularly, to a method for removing moisture in an opening.

2. Description of Related Art

Along with rapid progress of semiconductor technology, dimensions of semiconductor devices are reduced and integrity thereof is promoted continuously to further advance operating speed and performance of integrated circuits (ICs). When the integration level of integrated circuits (ICs) is increased, surface area of a chip is not sufficient to fabricate the required interconnections in a single layer, so that a design including more than two layers of multi-level metal interconnections is adopted in the VLSI technology. The dual damascene process is a widely used metal interconnection technology due to the advantages of improving device reliability and enhancing throughput.

As the demand for the device integrity is raised, dramatic changes in physical properties, such as contact resistance among the device components, have to be considered so as to avoid a great impact on the operating speed and performance of the circuit. Taking an existing fabrication of a dual damascene structure as an example, after formation of a barrier layer but before a subsequent step, there is generally an idle time such that moisture or minor impurities are prone to be trapped on the barrier layer in the opening. Thereafter, the opening is filled with metallic copper (Cu) material in the subsequent procedure. Since the moisture is trapped in the opening, defects, e.g. voids in the resultant copper material, are usually caused by the following thermal treatment, thereby increasing the contact resistance and unfavourably impacting on the device performance.

As a result, how to effectively prevent the defects of the material filling in the opening and ensure device characters is one of the immediate issues to be solved in the art as critical dimensions of the opening is miniaturized, so as to expect improvements in the process reliability and the device performance.

SUMMARY OF THE INVENTION

Accordingly, the present invention is directed to a semiconductor process, upon which efficacious removal of moisture in an opening relies, and thereby voids are prevented from being formed in a conductive layer.

The semiconductor process of the present invention is described as follows. A substrate with at least one conductive region is provided, on which a dielectric layer is formed. An opening is formed in the dielectric layer, such that the conductive region is exposed. A first conductive layer is conformally formed on the surface of the opening. A first cleaning step is conducted using a first cleaning solution. A baking step is conducted after the first cleaning step. Afterwards, the opening is filled with a second conductive layer.

According to an embodiment of the present invention, a temperature for conducting the baking step ranges between 200° C. and 300° C.

According to an embodiment of the present invention, duration for conducting the baking step ranges between 30 minutes and 60 minutes.

According to an embodiment of the present invention, the first cleaning solution contains HF and $H_2SO_4$, wherein the content of HF is about 0.01 wt % to 0.1 wt % and the content of $H_2SO_4$ is about 1 wt % to 10 wt %.

According to an embodiment of the present invention, the first cleaning step and the baking step are conducted between the step of forming the first conductive layer and the step of forming the second conductive layer.

According to an embodiment of the present invention, a second cleaning step is further conducted utilizing a second cleaning solution before the step of forming the first conductive layer. The second cleaning solution may contain HF and $H_2SO_4$.

According to an embodiment of the present invention, the first cleaning step is conducted by a single-wafer clean tool.

According to an embodiment of the present invention, the first conductive layer is a barrier layer.

According to an embodiment of the present invention, the material of the first conductive layer can be titanium (Ti), titanium nitride (TiN), tungsten (W), tungsten nitride (WN), titanium-tungsten alloy (Ti—W alloy), tantalum (Ta), tantalum nitride (TaN), nickel (Ni), or nickel-vanadium alloy (Ni—V alloy).

According to an embodiment of the present invention, the second conductive layer is a plug or a conductive line.

According to an embodiment of the present invention, the material of the second conductive layer can be copper (Cu) or copper alloy.

According to an embodiment of the present invention, the opening can be a contact hole, a via hole, a conductive line opening or a dual damascene opening.

According to an embodiment of the present invention, a width of the opening is below 70 nm.

As mentioned above, after a conductive layer is conformally formed on the surface of the opening but before another conductive layer fills the opening, the present invention proposes conducting a cleaning step utilizing a cleaning solution and then conducting a baking step, so that the moisture or impurities trapped in the opening can be removed thoroughly. By means of the post-barrier layer cleaning and baking steps, voids can be prevented from being formed in the conductive layer that fills up the opening, thereby lowering the contact resistance and also improving the device performance.

In order to make the aforementioned and other features and advantages of the present invention more comprehensible, preferred embodiments accompanied with figures are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1:
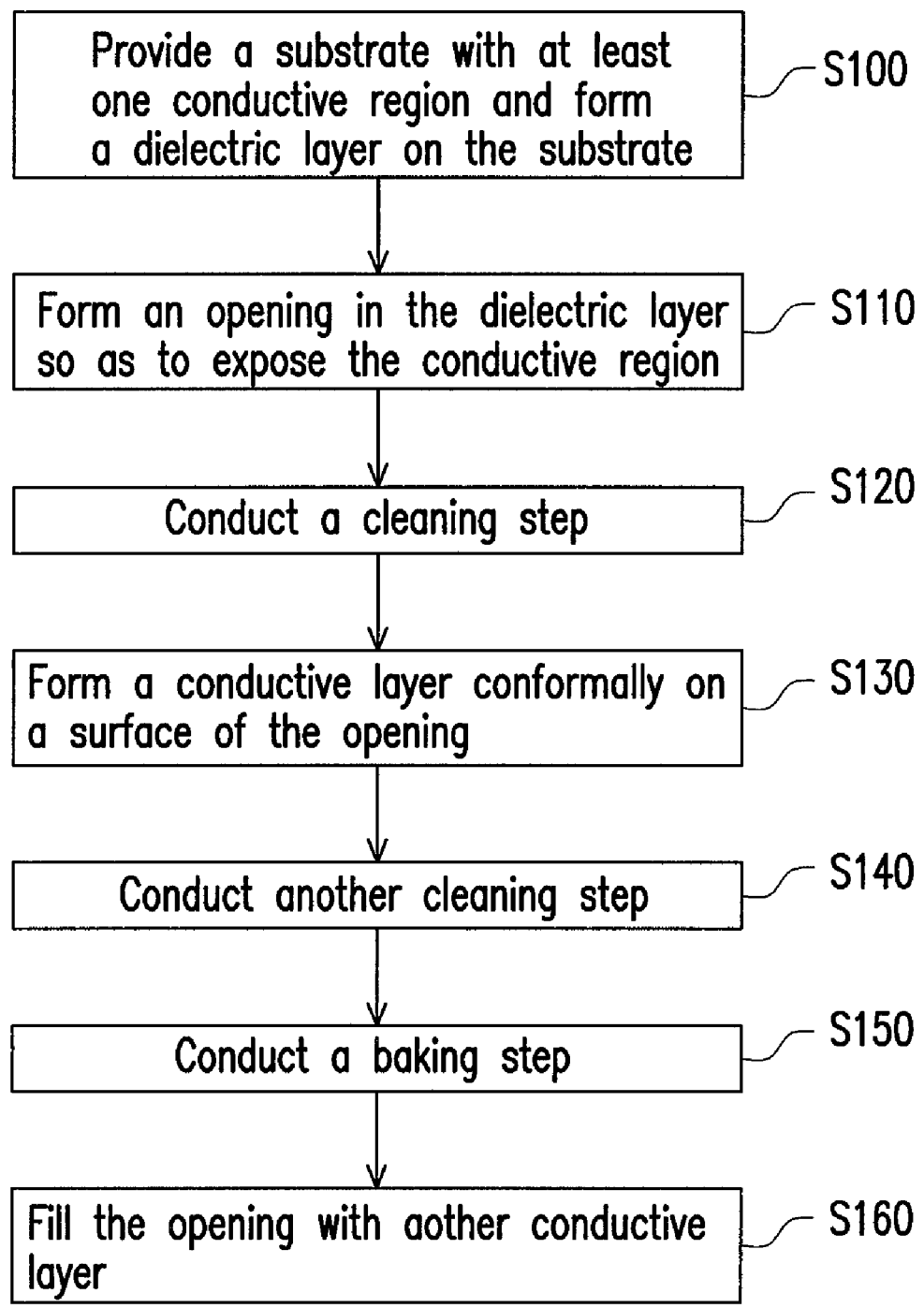
FIG. 1 shows a flowchart illustrating the semiconductor process according to an embodiment of the present invention.

Reference will now be made in detail to the present preferred embodiments of the invention, examples of which are illustrated in the accompanying drawings. Wherever possible, the same reference numbers are used in the drawings and the description to refer to the same or like parts.

Figure 2A:
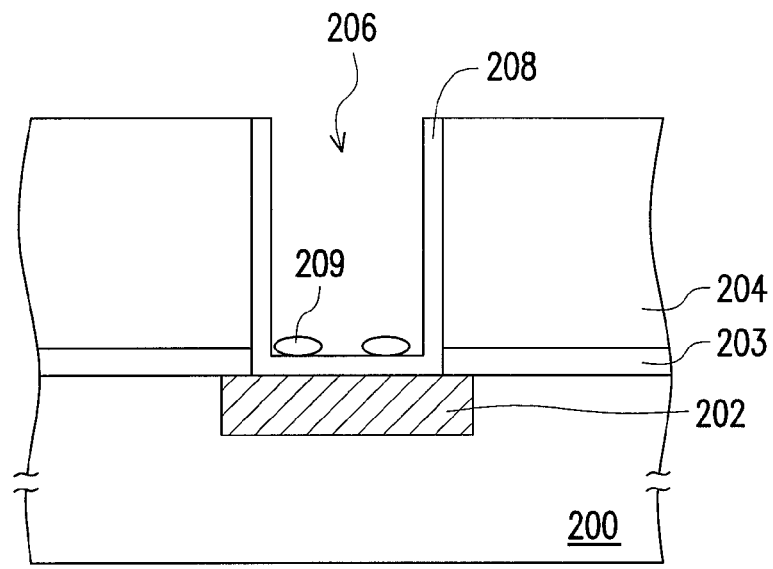
FIGS. 2A-2B depict, in a cross-sectional view, the semiconductor process according to an embodiment of the present invention.
Figure 2B:
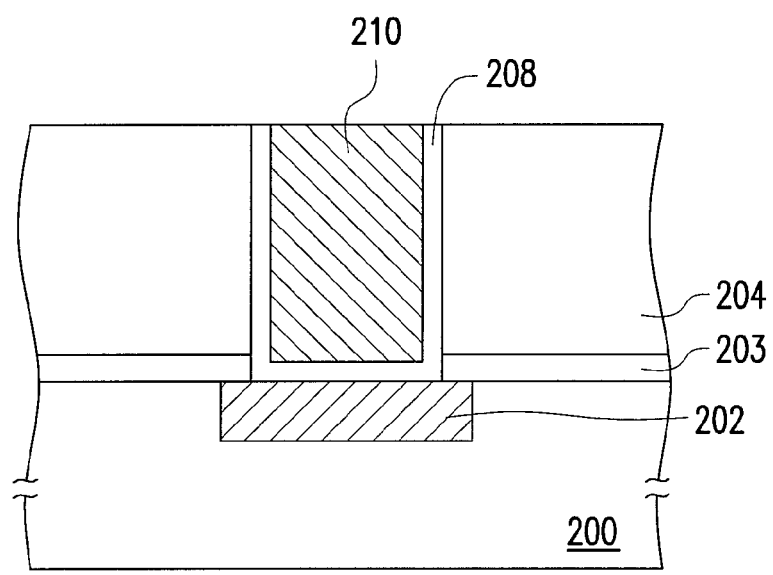

The semiconductor process according to the present invention is mainly applied to the backend process. The following flow chart and cross-sectional diagrams are utilized to explain embodiments of the present invention. FIG. 1 shows a flowchart illustrating the semiconductor process according to an embodiment of the present invention. FIGS. 2A-2B depict, in a cross-sectional view, the semiconductor process according to an embodiment of the present invention.

Referring to FIGS. 1 and 2A, step S100 is executed to provide a substrate 200 with a conductive region 202, and a dielectric layer 204 is formed on the substrate 200. The substrate 200 may be a semiconductor substrate, such as an n-type or a p-type silicon substrate, a group III-V semiconductor substrate and the like. The conductive region 202 can be a silicon-containing conductive region or a metalized conductive region, such as a gate, a doped region for source and drain, or interconnections. The material of the dielectric layer 204 is, for example, silicon oxide, boron phosphor silicon glass (BPSG), phosphor silicon glass (PSG) or a low-k material with a dielectric constant less than 3. The low-k material may be silsesquioxane such as hydrogen silsesquioxane (HSQ), methyl silsesquioxane (MSQ) and hybrido-organo siloxane polymer (HOSP); aromatic hydrocarbon such as SiLK; organosilicate glass such as black diamond (BD), 3MS and 4MS; parylene; fluoro-polymer such as PFCB, CYTOP and Teflon; poly(arylether) such as PAE-2 and FLARE; porous polymer such as XLK, Nanofoam and Aerogel; coral and the like.

In an embodiment, a cap stop layer 203 may be further disposed between the conductive region 202 and the dielectric layer 204, in order to separate the conductive region 202 and the dielectric layer 204. In addition, the cap stop layer 203 can function as an etching stop layer during a subsequent etching process for removing a part of the dielectric layer 204 to form an opening pattern. The material of the cap stop layer 203 is, for example, silicon carbonitride (SiCN) or silicon carbide (SiC).

An opening 206 exposing the conductive region 202 is formed in the dielectric layer 204 in step S110. The opening 206 is, for example, a contact hole, a via hole or a damascene opening just for a conductive line formation. In an embodiment, the formation of the opening 206 is carried out by forming a patterned photoresist layer (not shown) on the dielectric layer 204, then utilizing the patterned photoresist layer as a mask to remove the uncovered dielectric layer 204 until a part of the cap stop layer 203 is exposed. The said part of the cap stop layer 203 is then removed, and thereby the opening 206 exposing the conductive region 202 is formed. The patterned photoresist layer is removed. A dry etching process can be utilized for removing a part of the dielectric layer 204 and the cap stop layer 203 to form the opening 206 mentioned above.

After the dry etching process, there may be residual polymer particles or impurities remaining on the surface of the dielectric layer 204 or the opening 206, and these residuals may cause leakage or short circuit in the succeeding processes. For this reason, a cleaning step may proceed alternatively (step S120) to remove the residuals and avoid an impact on the following processes. In an embodiment, the cleaning step in step S120 utilizes a dilute solution of HF and $H_2SO_4$ as a cleaning solution. The content of HF ranges between about 0.01 wt % and about 0.1 wt % and the content of $H_2SO_4$ ranges between about 1 wt % and about 10 wt %. The cleaning step in step S120 may be performed by a single-wafer clean tool.

Afterward, step S130 is conducted to form a conductive layer 208 conformally on the surface of the opening 206. That is to say, the conductive layer 208 covers the sidewall and the bottom of the opening 206 along the shape of the opening 206. The conductive layer 208 serves as a barrier layer to improve adhesion between a conductive material to be formed in the opening 206 and the surface of the dielectric layer 204, and also to avoid metal diffusion of the conductive material. The material of the conductive layer 208 may be a refractory metal or a nitride or an alloy thereof such as titanium (Ti), titanium nitride (TiN), tungsten (W), tungsten nitride (WN), titanium-tungsten alloy (Ti—W alloy), tantalum (Ta), tantalum nitride (TaN), nickel (Ni), or nickel-vanadium alloy (Ni—V alloy). The forming method of the conductive layer 208 is physical vapor deposition or chemical vapor deposition, for instant.

As illustrated in FIGS. 1 and 2B, moisture 209 or a few impurities are prone to be trapped on the conductive layer 208 between the step of forming the conductive layer 208 and the following step of forming a conductive layer 210, thereby causing the defects like voids in the conductive layer 210 after thermal treatment. Therefore, in order to remove the moisture 209 or impurities trapped on the conductive layer 208 in the opening 206, steps S140 and S150 are performed after the formation of the conductive layer 208.

In step S140, a cleaning solution is utilized to perform another cleaning step. The cleaning solution utilized in the cleaning step can be a solution containing HF and $H_2SO_4$ diluted by DI water. In an embodiment, the content of HF ranges between about 0.01 wt % and about 0.1 wt %, and the content of $H_2SO_4$ ranges between about 1 wt % and about 10 wt %. The cleaning step in step S140 is, for example, performed by a single-wafer clean tool.

After step S140 is accomplished, a baking step is conducted (step S150) to remove the moisture 209 in the opening 206 thoroughly. In an embodiment, the temperature of conducting the baking step ranges between about 200° C. and about 300° C., and the duration of the baking step ranges between about 30 minutes and about 60 minutes.

Afterwards, the conductive layer 210 is formed in order to cover the conductive layer 208 and fill up the opening 206 in step S160. The material of the conductive layer 210 is, for example, metal such as copper (Cu) or Cu alloy. The formation of the conductive layer 210 can be physical vapor deposition or chemical vapor deposition or electric chemical plating.

Since the conductive layer 210 is not formed on the wafer immediately after the formation of the conductive layer 208, there is an idle time between these two steps conducted to the wafer, such that the moisture 209 or the impurities are prone to be trapped on the conductive layer 208 in the opening 206. Accordingly, before the formation of the conductive layer 210, a dilute solution of HF and $H_2SO_4$ is utilized for the cleaning step which is followed by the baking step (i.e. step S140 and step S150), so that the moisture 209 can be effectively eliminated. Voids are prevented from being formed in the conductive layer 210 filling the opening 206, and hence contact resistance of the conductive layer 210 can be lowered and the device performance is improved.

In the foregoing embodiment, for illustration purposes, a contact hole, a via hole or a damascene opening for a conductive line formed on the substrate 200 is illustrated only as an exemplary example, which is not to be construed as limiting the present invention. In other embodiments, the present invention can be applied to a dual damascene process or, in the alternative, to a process for 45 nm node or beyond. That is to say, the method proposed in the present invention may suitable for all opening with a width below 70 nm. People skilled in the art should be able to make modifications in accordance with requirements for the process, and moisture trapped in the opening can be removed by performing the post-barrier layer cleaning and baking steps, as illustrated in step S140 and step S150.

In the field of the dual damascene process, a practical application of the semiconductor process according to this invention is provided hereinafter. It is to be understood that the following procedures are intended to explain the sequence of the cleaning and baking steps after the formation of the barrier layer in the practical semiconductor process and thereby enable those of ordinary skill in the art to practice this invention, but are not construed as limiting the scope of this invention. It is appreciated by those of ordinary skill in the art that other elements, such as the substrate, the plug, the conductive line, the opening and the conductive region, can be arranged and formed in a manner or in an amount not shown in the illustrated embodiment according to known knowledge in the art.

FIGS. 3A-3D depict, in a cross-sectional view, the semiconductor process according to another embodiment of the present invention.

Figure 3A:
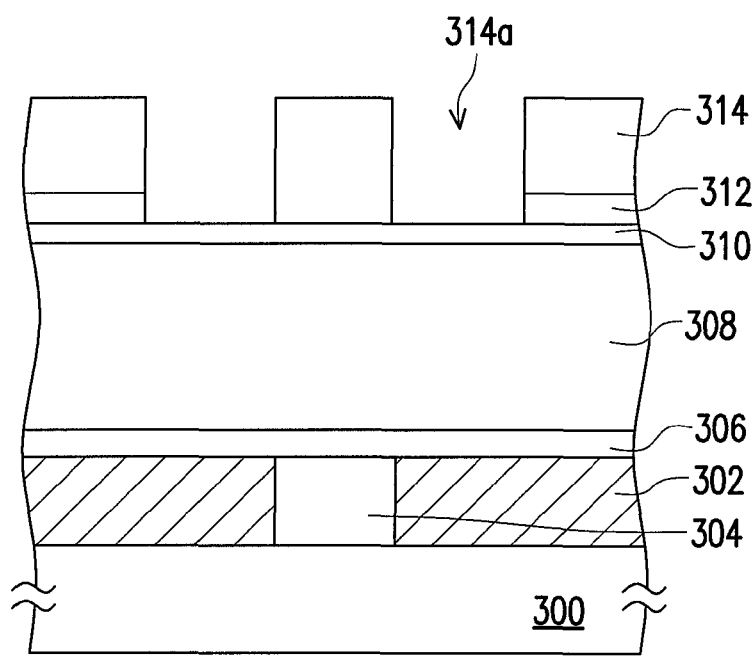
FIGS. 3A-3D depict, in a cross-sectional view, the semiconductor process according to another embodiment of the present invention.

Referring to FIG. 3A, a substrate 300 with conductive regions 302 is provided. The conductive regions 302 can be formed on the substrate 300, and a dielectric layer 304 is formed between the adjacent conductive regions 302. The conductive regions 302 can be conductive lines in the interconnection process, e.g. copper conductive lines. The material of the dielectric layer 304 is, for example, a low-k material with a dielectric constant less than 3.

A dielectric layer 308 and a patterned photoresist layer 314 are formed on the substrate 300 in sequence. The dielectric layer 308 is, for example, made of a low-k material with a dielectric constant less than 3, and the forming method thereof can be chemical vapor deposition. The patterned photoresist layer 314 includes a pattern 314a of via hole. The region covered by the patterned photoresist layer 314 may be located above a portion of the conductive regions 302 and above the dielectric layer 304. In an embodiment, a stop layer 306 can be optionally formed between the dielectric layer 308 and the conductive regions 302 and also between the dielectric layer 308 and the dielectric layer 304. In an embodiment, a buffer layer 310 can be optionally formed between the dielectric layer 308 and the patterned photoresist layer 314. In an embodiment, another stop layer 312 can be alternatively formed between the buffer layer 310 and the patterned photoresist layer 314 located above the conductive regions 302. The stop layer 312 has an opening, and this opening may be patterned before formation of the patterned photoresist layer 314 is finished, which is similar to FIG. 2A. The material of the stop layer 306 is, for example, silicon carbonitride (SiCN) or silicon carbide (SiC). The material of the buffer layer 310 is, for example, silicon oxide or silicon oxynitride (SiON). The material of the stop layer 312 is, for example, titanium nitride (TiN), titanium (Ti), tantalum nitride (TaN) or tantalum (Ta). People skilled in the art should be able to appreciate the methods for forming the above-mentioned film layers, and thus, detailed descriptions thereof are not described herein.

Figure 3B:
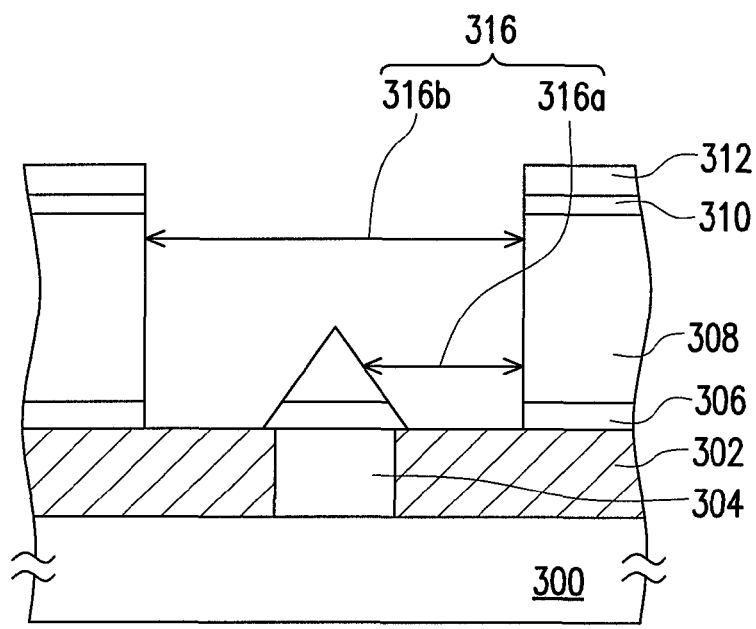

Referring to FIG. 3B, portions of the buffer layer 310, the dielectric layer 308 and the stop layer 306 are removed using the patterned photoresist layer 314 as a mask, so that an opening 316 is formed and a partial surface of the conductive regions 302 is exposed. In an embodiment, the opening 316 may be a dual damascene opening for a dual damascene structure to be formed, and include a via hole 316a and a trench 316b. The formation of the opening 316 can be achieved by a single step of dry etching process. In detail, when a portion of the dielectric layer 308 is removed using the patterned photoresist layer 314 as a mask, the pattern 314a is transferred to the dielectric layer 308 in advance, and an opening that exposes the partial stop layer 306 is formed in the dielectric layer 308. Then, after removing the patterned photoresist layer 314, the buffer layer 310 and a portion of the dielectric layer 308 located above the dielectric layer 304 are removed in the continuous dry etching process due to the absence of stop layer 312 above the dielectric layer 304. The exposed stop layer 306 above the conductive regions 302 is removed at the same time. The via hole 316a and the trench 316b are thus formed to expose a portion of the conductive regions 302.

Thereafter, a cleaning step is alternatively conducted, so as to remove residuals in the dry etching process. The cleaning step, for example, utilizes a dilute solution of HF and $H_2SO_4$ serving as a cleaning solution, wherein the content of HF is about 0.01 wt % to 0.1 wt % and the content of $H_2SO_4$ is about 1 wt % to 10 wt %.

Figure 3C:
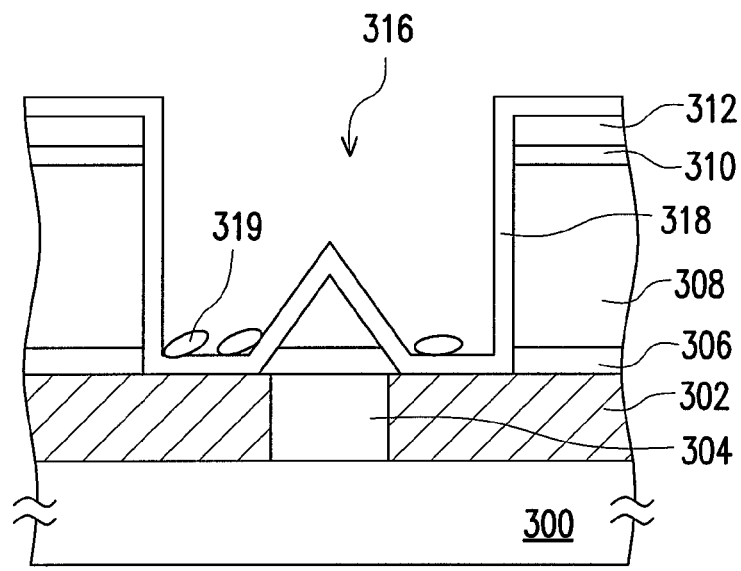

Referring to FIG. 3C, a conductive layer 318 is then formed on the surface of the opening 316 conformally, so as to cover the sidewall and the bottom of the opening 316. The conductive layer 318 may serve as a barrier layer, and the material thereof can be a refractory metal or a nitride or an alloy thereof such as titanium (Ti), titanium nitride (TiN), tungsten (W), tungsten nitride (WN), titanium-tungsten alloy (Ti—W alloy), tantalum (Ta), tantalum nitride (TaN), nickel (Ni), or nickel-vanadium alloy (Ni—V alloy).

As shown in FIG. 3C, after the conductive layer 318 is formed but before the opening 316 is filled with a conductive material of the dual damascene structure, moisture 319 is easily trapped on the conductive layer 318. Accordingly, before filling the opening 316 with the conductive material to form the dual damascene structure, the post-barrier layer cleaning and baking steps mentioned above can be conducted likewise so as to remove the moisture 319 in the opening 316 thoroughly. More specifically, the cleaning step is implemented with use of a dilute solution of HF and $H_2SO_4$ as a cleaning solution. In an embodiment, the content of HF is about 0.01 wt % to 0.1 wt % and the content of $H_2SO_4$ is about 1 wt % to 10 wt %. After accomplishment of the cleaning step, the temperature of conducting the baking step is about 200° C. to 300° C., and the duration thereof is about 30 minutes to 60 minutes.

Figure 3D:
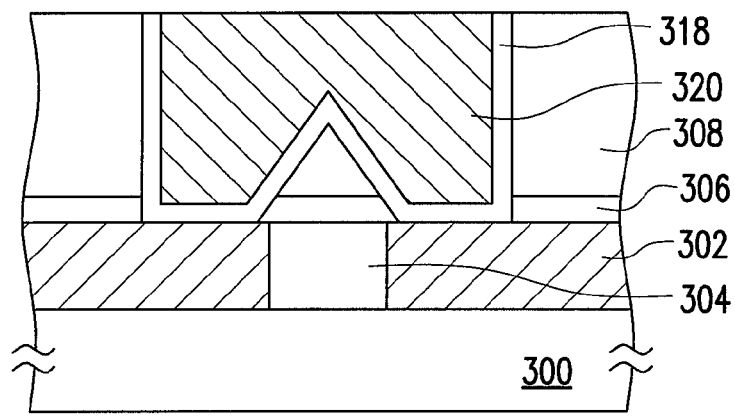

Referring to FIG. 3D, a conductive layer 320 is then formed on the substrate 300. The conductive layer 320 fills up the opening 316, and electrically connects with the conductive regions 302, thereby accomplishing the fabrication of the dual damascene structure. The conductive layer 320 may be made of metal, such as copper (Cu) or Cu alloy.

After the conductive layer 318 is formed on the surface of the opening 316 but before the conductive layer 320 is formed, the moisture 319 in the opening 316 is thoroughly removed by means of the cleaning and baking steps as illustrated in step S140 and step S150 of FIG. 1. Accordingly, voids formed in the conductive layer 320 can be effectively avoided, and the contact resistance of the dual damascene structure can thus be decreased.

The following example is provided to prove that the semiconductor process of the present invention can remove the moisture in the opening and thus reduce the contact resistance. This example is provided to illustrate effects upon contact resistance (Rc) made by the implementation of the semiconductor process in the present invention, but is not intended to limit the scope of the present invention.

Example

Figure 4:
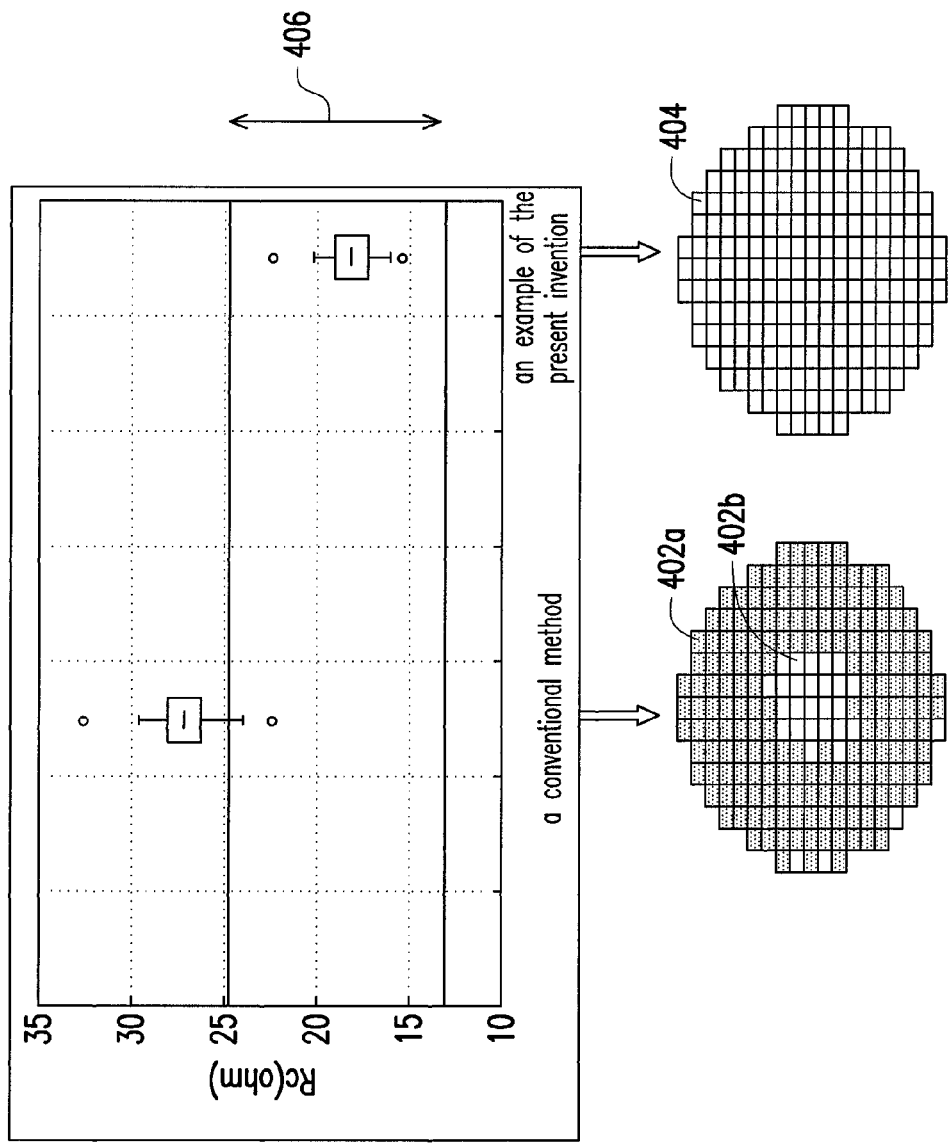
FIG. 4 is a comparative distribution diagram schematically illustrating an average contact resistance of dies measured after formation of dual damascene structures on a wafer respectively fabricated by a conventional method and an example of the present invention.

FIG. 4 is a comparative distribution diagram schematically illustrating an average contact resistance of dies measured after formation of dual damascene structures on a wafer respectively fabricated by a conventional method and an example of the present invention.

Referring to FIG. 4, in the conventional method, after tantalum (Ta) and tantalum nitride (TaN) serving as a barrier layer is conformally formed on a surface of a dual damascene opening, the opening is filled with copper to accomplish a dual damascene structure without other process treatments intervening therebetween. The contact resistance of the dual damascene structure in each die 402a and 402b of the wafer is then measured, and results are shown in the form of an Rc map. Nevertheless, in the example of the present invention, after tantalum (Ta) and tantalum nitride (TaN) serving as a barrier layer is conformally formed on a surface of a dual damascene opening, a cleaning step and a baking step are performed in sequence. A cleaning solution containing about 0.06% HF and 3% $H_2SO_4$ is utilized in the cleaning step, and the wafer is then baked at a temperature of 200° C.-300° C. for 30 minutes. Thereafter, the dual damascene opening is filled with copper to accomplish a dual damascene structure. The contact resistance of the dual damascene structure in each die 404 of the wafer is then measured, and results are shown in the form of an Rc map.

In addition, the average contact resistance of dies fabricated by the conventional method is compared with that of dies fabricated by the example of the present invention, wherein a range 406 represents acceptance of contact resistance. As shown in FIG. 4, the dual damascene structure fabricated by the conventional method is provided with higher contact resistance, while the dual damascene structure fabricated by the example of the present invention is provided with lower contact resistance within the range 406.

It is noted that since there is an idle time for the wafer between the step of forming the barrier layer and the step of filling the opening with copper, the moisture or the impurities are prone to be trapped in the opening. In general, the moisture is much easily trapped on the dies located near the periphery of the wafer. As shown in FIG. 4, in the conventional method, the contact resistance of the dual damascene structure in the dies 402a near the periphery of the wafer is higher than that in the dies 402b near the center of the wafer. The contact resistance of the dies 402a exceeds the range 406, and the contact resistance of the dies 402b is within the range 406. By contrast, in the example of the present invention, the contact resistance of the dual damascene structure in the dies 404 is entirely within the range 406. Hence, the semiconductor process proposed in the present invention can lower the contact resistance of the conductive layer, and the device performance can thus be improved.

In view of the above, the semiconductor process according to the present invention is carried out by performing a cleaning step utilizing dilute HF and $H_2SO_4$ as a cleaning solution and a following baking step, after a conductive layer is conformally formed on the surface of the opening but before another conductive layer fills the opening. Therefore, the moisture or impurities trapped in the opening can be efficiently eliminated. The moisture is thoroughly removed from the opening by means of the post-barrier layer cleaning and baking steps, and defects, e.g. voids, can thus be prevented from being formed in the conductive layer filling the opening after thermal treatment, so as to facilitate the reduction in the contact resistance of the conductive layer and the enhancement of the device performance.

Moreover, even if the critical dimensions of the opening is miniaturized in 45 nm node or beyond, the semiconductor process according to the present invention can still guarantee the device characters formed in the opening, thereby improving the process reliability advantageously.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A semiconductor process, comprising:
    providing a substrate with at least one conductive region, and a dielectric layer is formed on the substrate;
    forming an opening in the dielectric layer, so as to expose the conductive region;
    conformally forming a first conductive layer on a surface of the opening;
    conducting a first cleaning step utilizing a first cleaning solution to clean the first conductive layer;
    conducting a baking step to the first conductive layer after the first cleaning step; and
    filling the opening with a second conductive layer after the baking step, the second conductive layer covering and having direct contact with the first conductive layer.

2. The semiconductor process according to claim 1, wherein a temperature for conducting the baking step ranges between 200° C. and 300° C.

3. The semiconductor process according to claim 1, wherein a duration for conducting the baking step ranges between 30 minutes and 60 minutes.

4. The semiconductor process according to claim 1, wherein the first cleaning solution contains HF and $H_2SO_4$.

5. The semiconductor process according to claim 4, wherein a content of HF ranges between 0.01 wt % and 0.1 wt %.

6. The semiconductor process according to claim 4, wherein a content of $H_2SO_4$ ranges between 1 wt % and 10 wt %.

7. The semiconductor process according to claim 1, wherein the first cleaning step and the baking step are conducted between the step of forming the first conductive layer and the step of forming the second conductive layer.

8. The semiconductor process according to claim 1, before the step of forming the first conductive layer, further comprising conducting a second cleaning step utilizing a second cleaning solution.

9. The semiconductor process according to claim 8, wherein the second cleaning solution contains HF and $H_2SO_4$.

10. The semiconductor process according to claim 1, the first cleaning step is conducted by a single-wafer clean tool.

11. The semiconductor process according to claim 1, wherein the first conductive layer is a barrier layer.

12. The semiconductor process according to claim 1, wherein the first conductive layer comprises titanium (Ti), titanium nitride (TiN), tungsten (W), tungsten nitride (WN), titanium-tungsten alloy (Ti—W alloy), tantalum (Ta), tantalum nitride (TaN), nickel (Ni), or nickel-vanadium alloy (Ni—V alloy).

13. The semiconductor process according to claim 1, wherein the second conductive layer is a plug or a conductive line.

14. The semiconductor process according to claim 1, wherein the second conductive layer comprises copper (Cu) or copper alloy.

15. The semiconductor process according to claim 1, wherein the opening comprises a contact hole, a via hole, a conductive line opening or a dual damascene opening.

16. The semiconductor process according to claim 1, wherein a width of the opening is below 70 nm.

* * * * *